United States Patent

Sandhu et al.

[11] Patent Number: 5,837,564
[45] Date of Patent: Nov. 17, 1998

[54] METHOD FOR OPTIMAL CRYSTALLIZATION TO OBTAIN HIGH ELECTRICAL PERFORMANCE FROM CHALCOGENIDES

[75] Inventors: Gurtej S. Sandhu; Alan R. Reinberg, both of Boise, Id.

[73] Assignee: Micron Technology, Inc., Boise, Id.

[21] Appl. No.: 551,726

[22] Filed: Nov. 1, 1995

[51] Int. Cl.⁶ .................................................. H01L 21/00
[52] U.S. Cl. ............................................ 438/95; 438/308
[58] Field of Search ................................ 437/51, 52, 101, 437/247; 148/DIG. 1; 438/95, 308, 795

[56] References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 4,099,260 | 7/1978 | Lynes et al. | 365/105 |
| 4,115,872 | 9/1978 | Bluhm | 365/163 |
| 4,174,521 | 11/1979 | Neale | 357/45 |
| 4,194,283 | 3/1980 | Hoffmann | 29/571 |
| 4,203,123 | 5/1980 | Shanks | 357/2 |
| 4,227,297 | 10/1980 | Angerstein | 29/571 |
| 4,272,562 | 6/1981 | Wood | 437/101 |
| 4,458,260 | 7/1984 | McIntyre et al. | 357/30 |
| 4,502,208 | 3/1985 | McPherson | 29/584 |
| 4,545,111 | 10/1985 | Johnson | 437/52 |
| 4,569,698 | 2/1986 | Feist | 148/1.5 |
| 4,757,359 | 7/1988 | Chiao et al. | 357/23.5 |
| 4,804,490 | 2/1989 | Pryor et al. | 437/24 |
| 4,809,044 | 2/1989 | Pryor et al. | 357/2 |
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |
| 5,144,404 | 9/1992 | Iranmanesh et al. | 357/51 |
| 5,166,096 | 11/1992 | Cote et al. | 437/195 |
| 5,166,758 | 11/1992 | Ovshinsky et al. | 257/3 |
| 5,177,567 | 1/1993 | Klersy et al. | 257/4 |
| 5,296,716 | 3/1994 | Ovshinsky et al. | 257/3 |
| 5,335,219 | 8/1994 | Ovshinsky et al. | 365/113 |
| 5,341,328 | 8/1994 | Ovshinsky et al. | 365/163 |
| 5,359,205 | 10/1994 | Ovshinsky | 257/3 |
| 5,510,629 | 4/1996 | Karpovich et al. | 257/50 |

FOREIGN PATENT DOCUMENTS

| | | | |
|---|---|---|---|
| 0 117 045 | 8/1984 | European Pat. Off. | H01L 45/00 |
| 60-109266 | 6/1985 | Japan | H01L 27/10 |
| 1 319 388 | 6/1973 | United Kingdom | H01L 9/00 |

OTHER PUBLICATIONS

Kim and Kim, "Effects of High–Current Pulses on Polycrystralline Silicon Diode with n–type Region Heavily Doped with Both Boron and Phosphorus," *J. Appl. Phys.*, 53(7):5359–5360, 1982.

Neale and Aseltine, "The Application of Amorphous Materials to Computer Memories," *IEEE*, 20(2):195–205, 1973.

Pein and Plummer, "Performance of the 3–D Sidewall Flash EPROM Cell," *IEEE*, 11–14, 1993.

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.

Post et al., "Polysilicon Emitters for Bipolar Transistors: A Review and Re–Evaluation of Theory and Experiment," *IEEE*, 39(7):1717–1731, 1992.

(List continued on next page.)

*Primary Examiner*—Chandra Chaudhari
*Attorney, Agent, or Firm*—Fletcher, Yoder & Edwards

[57] ABSTRACT

A method of fabricating a chalcogenide memory cell wherein a layer of chalcogenide material is deposited in an amorphous state. The layer of amorphous chalcogenide material is then etched to its final geometry while maintaining its amorphous structure. The final geometry of the chalcogenide material is then annealed thereby transforming it to a crystalline form.

15 Claims, 4 Drawing Sheets

OTHER PUBLICATIONS

Post and Ashburn, "The Use of an Interface Anneal to Control the Base Current and Emitter Resistance of p–n–p Polysilicon Emitter Bipolar Transistors," *IEEE*, 13(8):408–410, 1992.

Rose et al., "Amorphous Silicon Analogue Memory Devices," *J. Non–Crystalline Solids*, 115:168–170, 1989.

Schaber et al., "Laser Annealing Study of the Grain Size Effect in Polycrystalline Silicon Schottky Diodes," *J. Appl. Phys.*, 53(12):8827–8834, 1982.

Yamamoto et al., "the I–V Characteristics of Polycrystalline Silicon Diodes and the Energy Distribution of Traps in Grain Boundaries," *Electronics and Communications in Japan*, Part 2, 75(7):51–58, 1992.

Yeh et al., "Investigation of Thermal Coefficient for Polycrystalline Silicon Thermal Sensor Diode," *Jpn. J. Appl. Phys.*, 31(Part 1, No. 2A):151–155, 1992.

Oakley et al., "Pillars—The Way to Two Micron Pitch Multilevel Metallisation," *IEEE*, 23–29, 1984.

METHOD FOR OPTIMAL CRYSTALLIZATION TO OBTAIN HIGH ELECTRICAL PERFORMANCE FROM CHALCOGENIDES

BACKGROUND OF THE INVENTION

The present invention relates generally to phase or state changeable memory devices and, more particularly, to chalcogenide memory cells.

The use of electrically writable and erasable phase change materials, i.e., materials which can be electrically switched between generally amorphous and generally crystalline states or between different resistive states while in crystalline form, for electronic memory applications is well known in the art and is disclosed, for example, in U.S. Pat. Nos. 5,296,716 and 5,335,219 to Ovshinsky et al., the disclosures of which are incorporated herein by reference. U.S. Pat. Nos. 5,296,716 and 5,335,219 are believed to indicate generally the state of the art and to contain a discussion of the current theory of operation of chalcogenide materials.

Generally, as disclosed in the aforementioned Ovshinsky patents, such phase change materials can be electrically switched between a first structural state where the material is generally amorphous and a second structural state where the material has a generally crystalline local order. The material may also be electrically switched between different detectable states of local order across the entire spectrum between the completely amorphous and the completely crystalline states. That is, the switching of such materials is not required to take place between completely amorphous and completely crystalline states. Rather, the material can be switched in incremental steps reflecting changes of local order to provide a "gray scale" represented by a multiplicity of conditions of local order spanning the spectrum from the completely amorphous state to the completely crystalline state.

The material exhibits different electrical characteristics depending upon its state. For instance, in its amorphous state the material exhibits a lower electrical conductivity, i.e., a higher resistivity, than it does in its crystalline state. Thus, application of an electrical sensing current may be applied to the material to determine its state.

These memory cells are monolithic, homogeneous, and formed of chalcogenide material selected from the group of Te, Se, Sb, and Ge. Such chalcogenide materials can be switched between numerous electrically detectable conditions of varying resistivity in nanosecond time periods with the input of picojoules of energy. The resulting memory material is truly non-volatile and will maintain the integrity of the information stored by the memory cell without the need for periodic refresh signals. The subject memory material is directly overwritable so that the memory cells need not be erased (set to a specified starting point) in order to change information stored within the memory cells. Finally, the large dynamic range offered by the memory material provides for the gray scale storage of multiple bits of binary information in a single cell by mimicking the binary encoded information in analog form and, thereby, essentially storing multiple bits of binary encoded information as a single resistance value in a single cell.

The operation of known chalcogenide memory cells requires that a region of the chalcogenide memory material, called the chalcogenide active region, be subjected to a current pulse typically with a current density between about $10^5$ and $10^7$ amperes/cm$^2$. This current density may be accomplished by providing a small opening, referred to as a pore, in a dielectric material which is itself deposited onto a lower electrode material. The chalcogenide material is then deposited over the dielectric material and into the pore into contact with the lower electrode material. A top electrode material is then deposited over the chalcogenide material. Carbon is a commonly used electrode material although other materials have also been used, for example, molybdenum and titanium nitride. The chalcogenide active region is primarily defined by the volume of chalcogenide material that is contained within the pore defined by the opening in the dielectric material. The chalcogenide active region makes contact with the lower electrode at an interface area that is substantially equal to the cross sectional area of the pore.

Such conventional chalcogenide memory cells are typically fabricated in the form of an array with the layer of chalcogenide material deposited into an array of adjacent pores. The chalcogenide material is deposited in an amorphous or crystalline state (depending upon the deposition temperature) using conventional thin film deposition techniques. Chalcogenide material deposited in an amorphous state is then annealed in bulk to a crystalline state. The chalcogenide material is then etched using conventional methods to permit the formation of the individual chalcogenide memory cells which are typically separated by additional structures such as, for example, dielectric layers between adjacent chalcogenide memory cells.

The degree and nature of the crystallinity of the chalcogenide material of the chalcogenide memory cells has a direct bearing upon the programming characteristics of the chalcogenide memory cells. The programming characteristics of chalcogenide memory cells whose chalcogenide material has been annealed in bulk after the initial thin film deposition are often inconsistent and unpredictable in nature. This is principally caused by temperature gradients created within the bulk film during the annealing process that produce variations in the degree and nature of the crystallinity of the chalcogenide material throughout the bulk film.

The present invention is directed to overcoming, or at least reducing the affects of, one or more of the problems set forth above. In particular, the present invention provides a method of fabricating a multilevel chalcogenide memory cell wherein the chalcogenide memory material is annealed to the crystalline state after etching the amorphous chalcogenide memory material to its final geometry thereby providing a chalcogenide memory cell with predictable and consistent programming characteristics. As a result, an array of such chalcogenide memory cells may be fabricated each with consistent and predictable performance characteristics.

SUMMARY OF THE INVENTION

In accordance with one aspect of the present invention there is provided a method of fabricating a chalcogenide memory cell with predictable and consistent performance characteristics. The chalcogenide material is deposited in an amorphous state and then etched while still in the amorphous state. The final resulting structure is then annealed to transform the chalcogenide material into a crystalline state.

BRIEF DESCRIPTION OF THE DRAWINGS

The present invention will become more fully understood from the following detailed description of the preferred embodiments, taken in conjunction with the accompanying drawings in which.

DETAILED DESCRIPTION OF PREFERRED EMBODIMENTS

The present preferred embodiment provides chalcogenide memory cells with predictable and consistent programming characteristics. The chalcogenide memory cells are fabricated by depositing a thin film layer of chalcogenide material in an amorphous state. The amorphous layer of chalcogenide material is then etched to form the final geometry of the chalcogenide material while maintaining its amorphous state. The final geometry of the amorphous chalcogenide material is then annealed to the crystalline state. In this manner, the performance characteristics of the chalcogenide memory cell are predictable and consistent. The method further permits the fabrication of an array of such chalcogenide memory cells each with the same performance characteristics.

Figure 1:
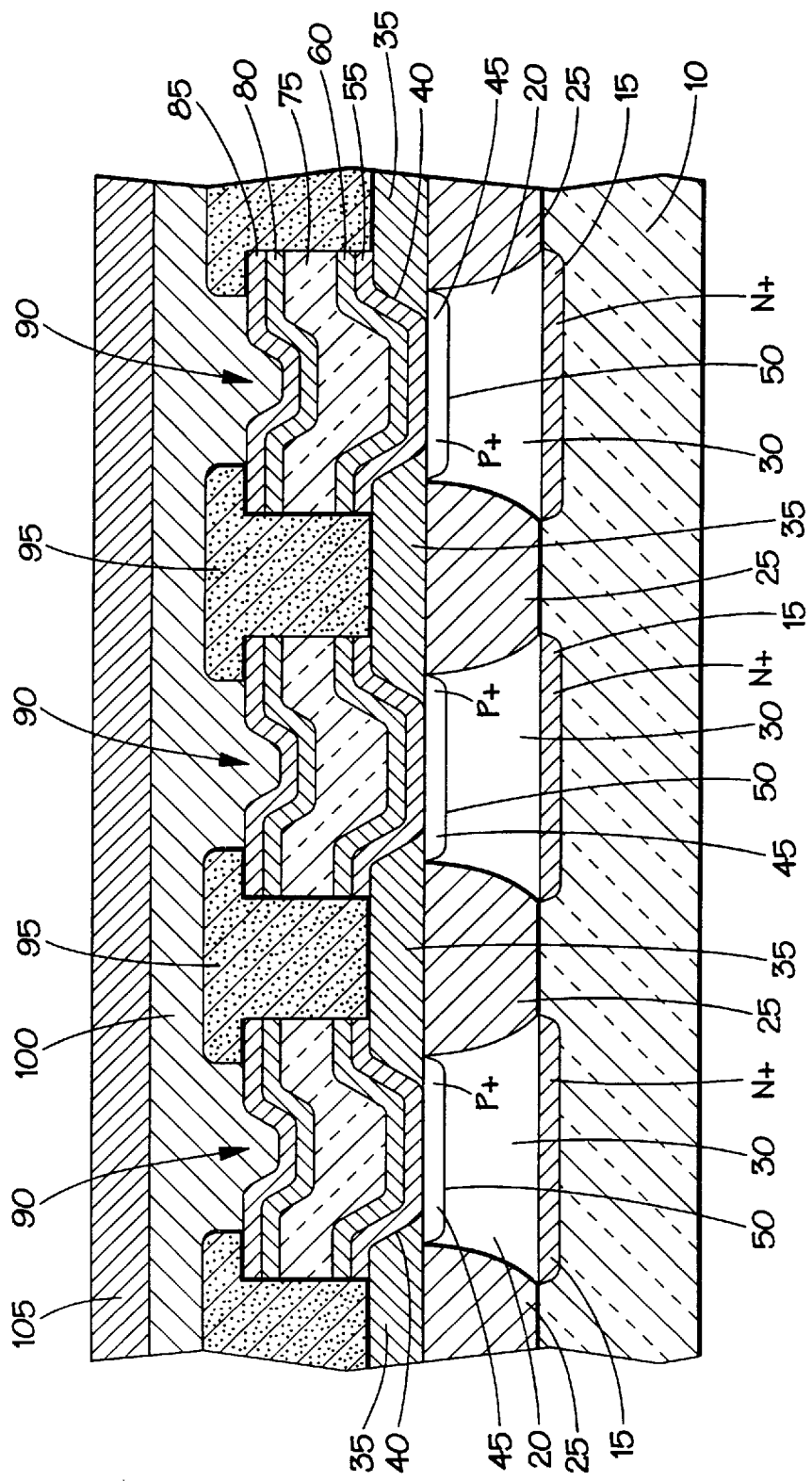
FIG. 1 is a fragmentary cross sectional view illustrating a portion of an integrated circuit electrically erasable and directly overwritable multibit memory configuration of a first preferred embodiment of the present invention.

Referring to FIG. 1, there is shown a cross sectional view of a portion of the structure of an electrically erasable memory. The memory structure is formed on a single crystal silicon semiconductor wafer 10 which is p-doped and which forms a p-substrate for the deposition of the remaining elements of the configuration illustrated.

Formed in the p-substrate 10 are n+ channels 15, which may be formed by diffusion in a manner well known in the art. These n+ channels 15 extend across the chip in a direction perpendicular to the plane of the illustration and form one set of conductive access lines, in this case the y set, of an x-y grid for addressing the individual memory cells.

Figure 3:
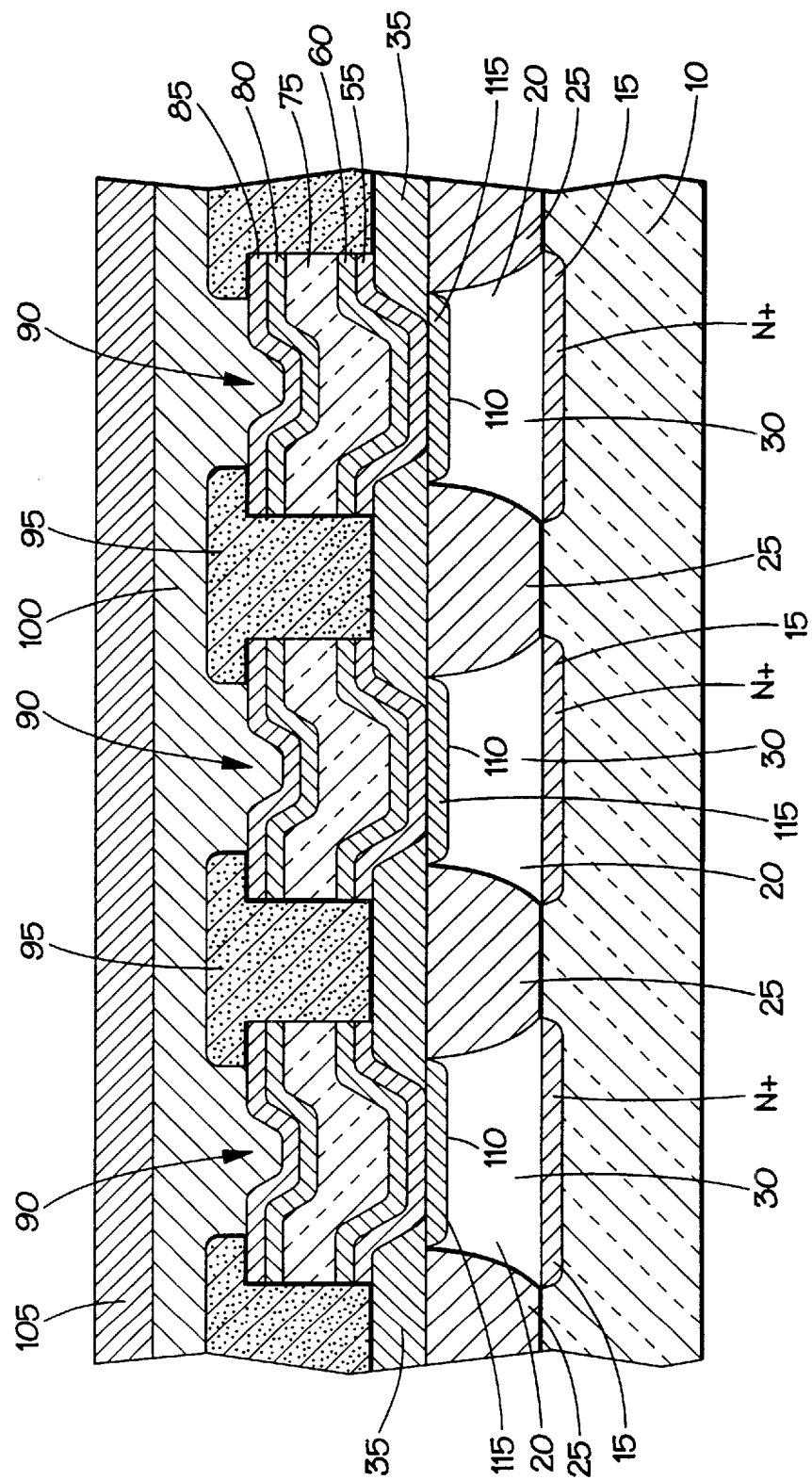
FIG. 3 is a fragmentary cross sectional view illustrating a portion of an integrated circuit electrically erasable and directly overwritable multibit memory configuration of a second preferred embodiment of the present invention.

An n-doped crystalline epitaxial layer 20 is formed on top of this n+ grid structure by techniques well known in the art. The n-doped epitaxial layer 20 may be about 5,000 Angstroms thick, for example. Using known masking and doping techniques, p-doped isolation channels 25 are then formed in the n-epitaxial layer 20. These p-doped isolation channels 25 extend down to the p-substrate 10 as shown in FIG. 3. The isolation channels 25 extend completely around and isolate adjacent memory cells from one another and define islands 30 of the n-epitaxial layer 20. The islands 30 are shown more clearly in the top view of FIG. 4 wherein the p-doped isolation channels 25 are shown as forming an isolation grid defining and isolating the islands 30 of the n-doped epitaxial material 20. Instead of the p-doped isolation channels 25, $SiO_2$ isolation trenches may be used for isolation of the islands 30. The technique of formation of such $SiO_2$ isolation trenches is well known to those skilled in the art.

A layer 35 of thermally grown $SiO_2$ is then formed on the structure just described and etched out to form apertures 40 over the islands 30. Diffusion regions 45 of p+ material are then formed within the areas defined by the apertures 40 as shown in FIG. 1. The semiconductor junctions of the p+ regions 45 and the n-doped epitaxial layer 20 form p-n junction diodes 50 in series with each of the regions of the n-doped epitaxial layer 20 exposed through the apertures 40 of the $SiO_2$ layer 35.

The bottom electrode contact layers 55 and 60 are then deposited using well known deposition techniques within the apertures 40 of the $SiO_2$ layer 35. The electrode contact layer 55 may be comprised of titanium nitride or tungsten silicide, and it is preferably comprised of molybdenum. The electrode contact layer 60 may or may not be present, but when present it is preferably comprised of carbon.

A chalcogenide layer 75 is then deposited over the layer 35 of thermally grown $SiO_2$ and into the pore defined by the aperture 40. The volume of the chalcogenide layer 75 within the pore defined by the aperture 40 forms a portion of the active region of the chalcogenide material of the memory cell, and the diameter, or minimum lateral dimension, of the aperture 40 determines the active region within the chalcogenide layer 75. The chalcogenide layer 75 is deposited using well known thin film deposition techniques with the as deposited chalcogenide layer 75 in an amorphous or high resistance state. The remaining upper contact electrode layers of carbon 80 and molybdenum 85 are then deposited in a well known manner while maintaining the processing operating temperatures in the range of about 25 to 150° C. thereby ensuring that the chalcogenide layer 75 is maintained in the amorphous state. In a preferred embodiment, all subsequent processing steps performed prior to annealing the final geometry of the chalcogenide layer 75 are performed below about 200° C.

Figure 2:
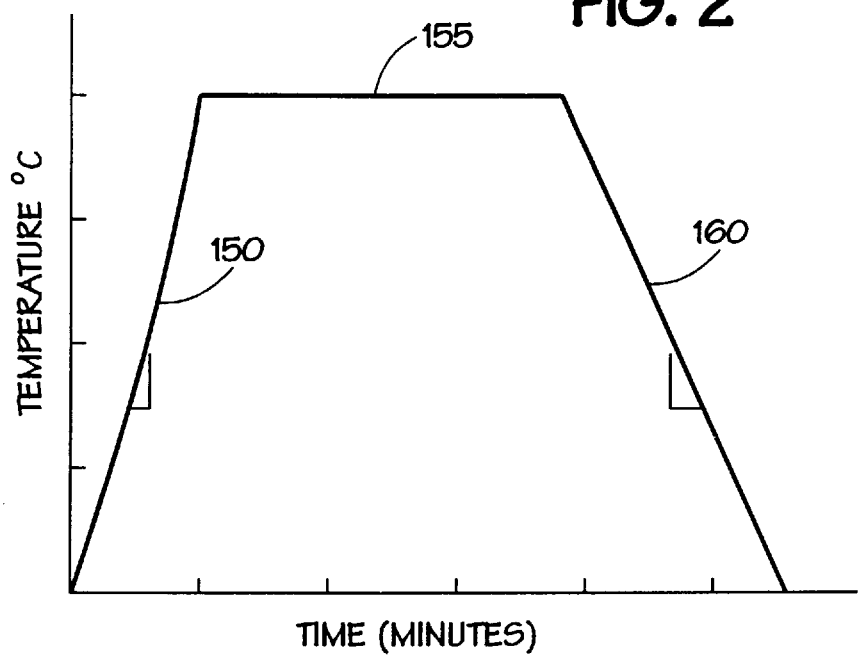
FIG. 2 is a graphical illustration of a preferred embodiment of the annealing process of the final etched structure of the chalcogenide layers of the present preferred embodiments.

The combination of the lower contact electrode layers of carbon 55 and molybdenum 60, the chalcogenide layer 75 (including the active chalcogenide region within the pore defined by the apertures 40), and the upper contact electrode layers of carbon 80 and molybdenum 85 form the individual memory cells 90. As shown in FIG. 2, the chalcogenide memory cells 90 are deposited over the p+ regions 45 in individual ohmic electrical series contact with the diodes 50.

Typical chalcogenide compositions for these memory cells 90 include average concentrations of Te in the amorphous state well below 70%, typically below about 60% and ranging in general from as low as about 23% up to about 56% Te and most preferably to about 48% to 56% Te. Concentrations of Ge are typically above about 15% and range from a low of about 17% to about 44% average in the high resistance state, remaining generally below 50% Ge, with the remainder of the principal constituent elements in this class being Sb. The percentages given are atomic percentages which total 100% of the atoms of the constituent elements. In a particularly preferred embodiment, the chalcogenide compositions for these memory cells comprise a Te concentration of about 55%, a Ge concentration of about 22%, and a Sb concentration of about 22%. This class of materials are typically characterized as $Te_aGe_bSb_{100-(a+b)}$, where a is equal to or less than about 70% and preferably between about 60% to about 40%, b is above about 15% and less than 50%, preferably between about 17% to about 44% and the remainder is Sb.

The contact layers 55, 60, 80 and 85 of carbon and molybdenum form excellent electrical contacts with the chalcogenide layer 75 and also form diffusion barriers which effectively block diffusion of elements into and out of the chalcogenide layer 70. The carbon layers, 60 and 80, have a relatively high electrical resistivity and are more difficult to etch and are, therefore, preferably relatively thin, typically in the range of approximately 100 to 1,000 Angstroms. The molybdenum layers 55 and 85 should be thicker, preferably in the range of about 1,000 to 2,000 Angstroms, in order to act as effective diffusion barriers for the chalcogenide layers 65 and 75.

The chalcogenide layer 75 is formed of a multi-element material, such as the chalcogenide materials disclosed herein. The layers are preferably sputter deposited in the high resistance or amorphous state, but may be formed in other ways such as by evaporation or by chemical vapor deposition in the high resistance or amorphous state, which may be enhanced by plasma techniques such as RF glow discharge. The chalcogenide layer 75 may typically range in thickness from about 100 Angstroms to about 1000 Angstroms, and preferably it is about 300 to 800 Angstroms and most preferably it is about 400 to 600 Angstroms in thickness. The lateral dimension or diameter of the pore of the chalcogenide active region defined by the aperture 40 may be in the range of less than about 0.5 to 1 micrometers or so, although there is no practical limit on the lateral dimension. The pore diameter can be as small as lithography resolution limits will permit.

In a preferred embodiment, the pore diameter is selected such that it conforms approximately with the diameter of the low resistance path which is formed when the material is switched to the low resistance state. The diameter of the pore of the memory cell 90 is therefore preferably less than about one micrometer so that the volume of the chalcogenide material within the chalcogenide active region is limited as much as is feasible to the volume of the chalcogenide material which is actually switched back and forth between the high and low resistance states. This further reduces the switching time and the electrical energy required to initiate the detectable change in resistance.

It is further preferred that the pore regions of the memory cells 90 be thermally isolated and/or controlled except only for the required electrical contacts with the upper and lower contacts as necessary for proper operation of the memory cells 90. This further confines, limits and controls the heat transfer from the switched volume of the pore the electrical energy required for the resistance transitions. This is accomplished in the embodiments of FIGS. 1 and 3 by the oxide layers 35 and 95 which surround the lateral peripheral portions of the memory cells 90.

The layers 55, 60, 75, 80, and 85 are then etched using conventional techniques to permit the oxide layer 95 to be formed thereover. The etching process is performed at temperatures below around 150° C. thereby maintaining the amorphous state of the chalcogenide layers 75.

After etching of the layers 55, 60, 75, 80, and 85, the resulting final geometries of the chalcogenide layers 75 are annealed by a thermal annealing process at temperatures ranging from about 150 to 400° C., and preferably at about 250° C. The entire structure is maintained at these elevated temperatures for a period of about 1 to 60 minutes, and preferably for about 10 minutes. A time-temperature curve for a preferred embodiment of this annealing process is illustrated in FIG. 2.

As shown in FIG. 2, the preferred annealing process includes an initial stage 150 in which the temperature is ramped up, an intermediate stage 155 where the temperature is maintained at the annealing temperature, and a final stage 160 in which the temperature is ramped down. The rate of change of the temperature during the temperature ramping stages 150 and 160 are limited to prevent excessive temperature gradients from developing within the structure. The temperature may be increased during the initial ramping up stage at rates ranging from about 10 to 50° C./Min, and preferably at approximately 20° C./Min. The temperature may be decreased during the final ramping down stage at rates ranging from about 10 to 50° C./Min, and preferably at approximately 30° C./Min. The resulting chalcogenide layers 75 are thereby transformed to a low resistance or crystalline state.

The resulting crystalline chalcogenide layers 75 provide consistent and predictable programming characteristics. By waiting to anneal the amorphous chalcogenide material until the final geometries of the chalcogenide material have been formed, the present method eliminates the large temperature gradients created by the prior art method of annealing the amorphous chalcogenide material in bulk prior to forming the final geometries.

After the chalcogenide layers 75 are annealed, the oxide layer 95 is then formed thereover and etched to leave openings above the memory cells 90 as shown. Deposited on top of the entire structure just described is the second electrode grid structure formed of aluminum conductors 100 which extend perpendicular in direction to the conductors 15 and complete the x-y grid connection to the individual memory cells 90. Overlaying the complete integrated structure is a top encapsulating layer 105 of a suitable encapsulant, such as silicon nitride, or a plastic material, such as polyamide, which seals the structure against moisture and other external elements which could cause deterioration and degradation of performance, particularly of the phase change materials in the memory cells 90. The silicon nitride encapsulant can be deposited, for example, using a low temperature plasma deposition process. The polyamide material can be spin deposited and baked after deposition in accordance with known techniques to form the encapsulant layer 105.

The embodiment of FIG. 3 is the same as FIG. 1 except that a diode 110 is formed of a Schottky barrier between the n-doped layer 20 and a metal layer 115 which may be, for example, platinum silicide. In other respects, the embodiment of FIG. 3 is formed in the same manner as that of FIG. 1, and like elements are labeled with like numerals.

Figure 4:
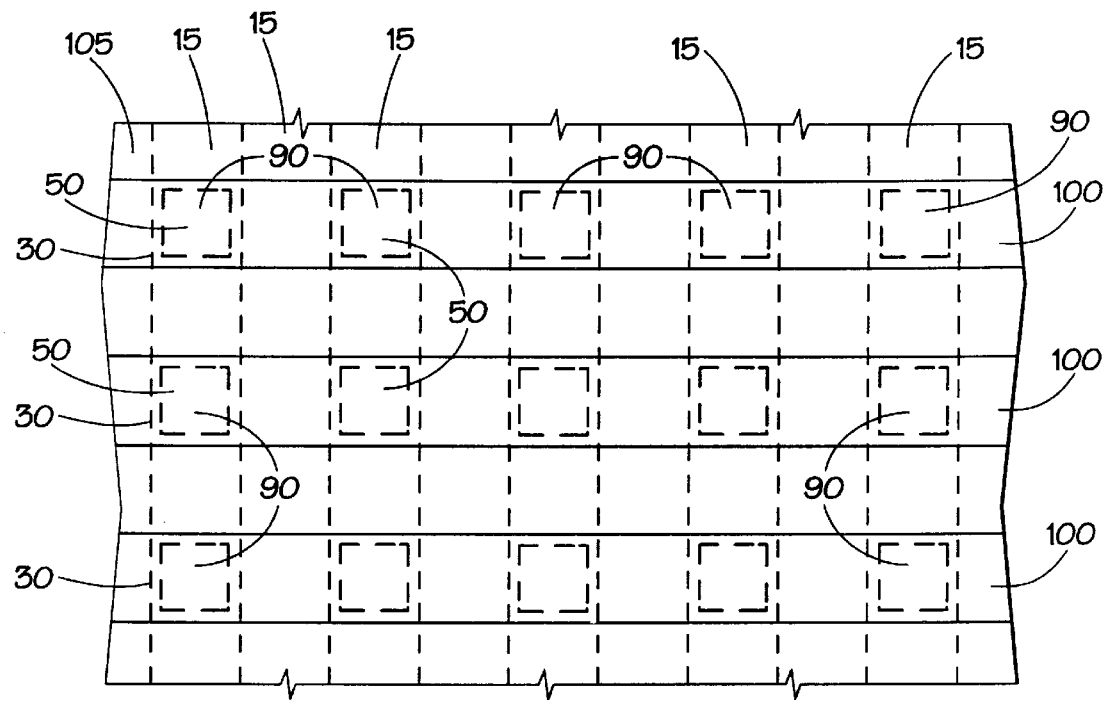
FIG. 4 is a top plan view illustrating a portion of the integrated circuit configurations of FIGS. 1 and 3.

The integrated structure thus formed is an x-y memory matrix connected as shown in FIG. 4 in which each memory cell 90 is connected in series with a diode 50 between a horizontal x-line 100 and a vertical y-line 15. The diodes 50 serve as access devices to isolate electrically each of the memory cells 90. Other types of access devices may also be utilized in accordance with the present preferred embodiment. Other circuit configurations for the electrically erasable memory of the present preferred embodiment are, of course, possible and feasible to implement. One particularly useful configuration is a three dimensional, multilevel array in which a plurality of planes of memory cells 90 and their respective isolation devices are stacked upon one another. Each plane of memory cells 90 is arranged as a plurality of rows and columns of memory cells 90, thereby allowing for X-Y addressing. This stacking of planes, in addition to increasing memory storage density, allows for an additional Z dimension of interconnection. The three-dimensional, thin-film memory array structures of the present preferred embodiment are capable of both conventional serial information processing as well as parallel information processing. Parallel processing and therefore multidimensional memory array structures are required for rapid performance of complex tasks such as pattern recognition, classification or associative learning.

With the integrated structure as shown in the embodiment of FIGS. 1 and 3, however, a completely vertically integrated structure of the memory cells 90 and its isolating diode is formed, thus minimizing the area occupied on the substrate by each of the combinations of memory cells 90 and diodes. This means that the density of the memory cells 90 in the chip is limited essentially only by the resolution of the lithography.

Figure 5:
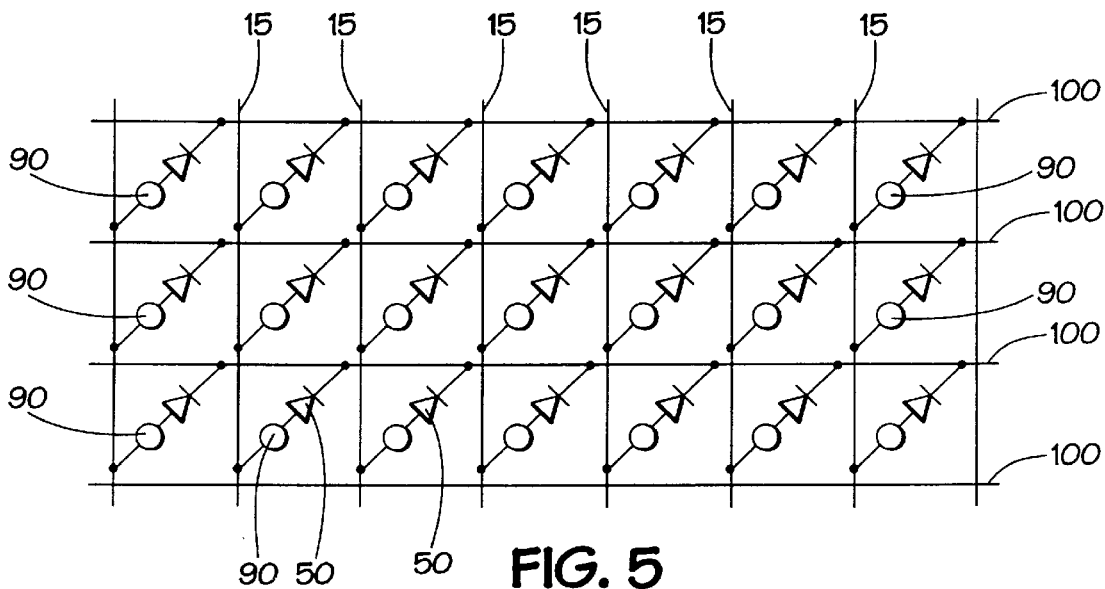
FIG. 5 is a schematic circuit diagram illustrating a portion of the circuitry of the integrated circuit configurations of FIGS. 1 and 3.

FIG. 5 is a circuit diagram of a portion of the embodiments of FIGS. 1–4. The circuit comprises an x-y grid with each of the memory cells 90 being connected in series with a diode 50 at the cross points of the x address lines 100 and the y address lines 15 as shown. The address lines 15 and 100 are connected to external addressing circuitry in a manner well known to those skilled in the art.

Figure 6:
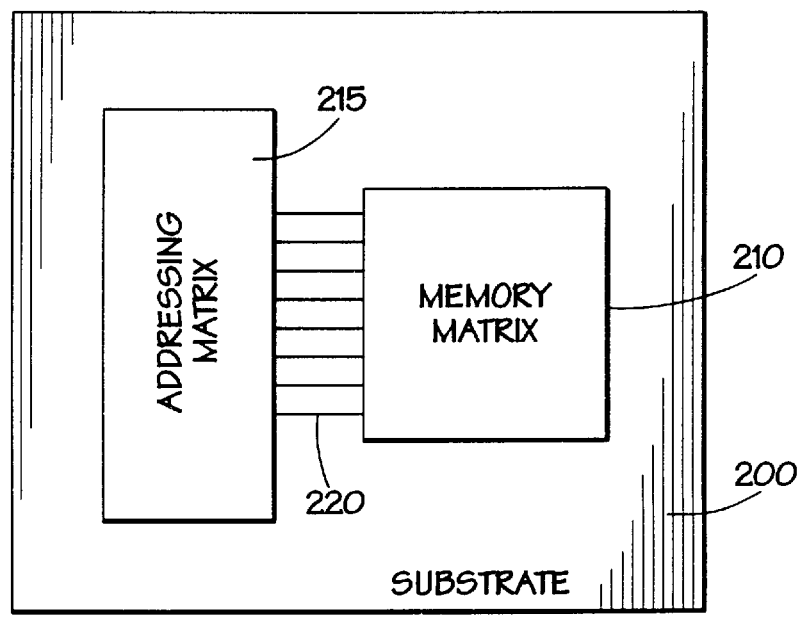
FIG. 6 is a diagrammatical illustration illustrating a portion of a single crystal semiconductor substrate with the integrated memory and addressing matrixes depicted in FIGS. 1 and 3.

In FIG. 6, there is diagrammatically illustrated a portion of a single crystal semiconductor substrate 200 with a memory matrix 210 of the present preferred embodiment formed thereon. Also formed on the same substrate 200 is an addressing matrix 215 which is suitably connected through integrated connections 220 to the memory matrix 210. The addressing matrix 215 includes signal generating means which define and control the setting and read pulses applied to the memory matrix 210. The addressing matrix 215 may be integrated with and formed simultaneously with the memory matrix 210.

The memory of the present preferred embodiment provides for a bit density which is greater than that attainable even in solid state dynamic random access memories (DRAM's), which are volatile and, therefore, lack the further advantages that non-volatility attainable with the present preferred embodiment provides. The increase in bit density attainable with the present preferred embodiment is translated into a corresponding reduction in manufacturing costs because of the smaller areas of the wafer occupied per bit of the integrated circuit configuration. This allows the memory of the present preferred embodiment to compete with and surpass other available memories for a wider range of applications, not only in terms of electrical performance and memory storage capacity but also in terms of cost.

By comparison with prior art semiconductor memories formed of at least one transistor and a capacitor for each bit, the integrated circuit configurations of the present preferred embodiments as shown in FIGS. 1 and 3 can be formed on a chip with greater bit density compared to prior art configurations for the same lithography resolution. In addition to the cost advantages which the higher bit density affords, the performance parameters of the memory in the integrated circuit configuration of the present preferred embodiment are thus even further improved in that the memory cells 90 are positioned closer together and lead lengths, capacitances and other related parameters are further minimized, thereby enhancing performance.

Of course, it is to be appreciated that the reduction in energy requirements correspond, inter alia, to a reduced volume of the memory material. Further reductions in the volume would further reduce the pulse energy required to set a memory cell 90 to a given resistance value. However, the volume requirement must be balanced taking into consideration the realities of modem wafer fabrication processing.

A method of providing optimal crystallization of chalcogenide materials has been described for use in fabricating chalcogenide memory cells. The method provides predictable and consistent programming characteristics of such chalcogenide materials by annealing the final geometry of the chalcogenide material. The final geometry having been produced by depositing the chalcogenide material in an amorphous form and then etching it to its final geometry while maintaining its amorphous state.

While the invention is susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the appended claims.

What is claimed is:

1. A method of fabricating a plurality of individual chalcogenide elements, comprising the steps of:
    applying a layer of amorphous chalcogenide material onto a substrate;
    etching said layer of amorphous chalcogenide material to form a memory array comprising a plurality of individual amorphous chalcogenide elements; and
    transforming all of said individual amorphous chalcogenide elements in the memory array to a crystalline state at once.

2. The method of claim 1, wherein said step of transforming comprises the step of annealing said amorphous chalcogenide elements.

3. The method of claim 2, wherein said step of annealing comprises the step of heating said amorphous chalcogenide elements to a temperature ranging from about 150 to 400° C. for a time period ranging from about 1 to 60 minutes.

4. The method of claim 1, wherein said chalcogenide material is selected from the group consisting of Se, Te, Ge, Sb and of compositions of at least two of Se, Te, Ge, and Sb.

5. The method of claim 4, wherein said chalcogenide material includes Te, Ge and Sb in the ratio $Te_a Ge_b Sb_{100-(a+b)}$ where the subscripts are in atomic percentages which total 100% of the constituent elements and a $\leq 70$ and $15 \leq b \leq 50$.

6. The method of claim 5, wherein $40 \leq a \leq 60$ and $17 \leq b \leq 44$.

7. A method of fabricating a plurality of chalcogenide memory cells, comprising the steps of:
    forming a plurality of current controlling devices on a substrate;
    applying a plurality of first electrodes on said respective current controlling devices;
    applying a layer of amorphous chalcogenide material onto said first electrodes;
    etching said layer of amorphous chalcogenide material to form a memory array comprising a plurality of amorphous chalcogenide elements;
    applying a plurality of second electrodes on said plurality of respective chalcogenide elements; and
    annealing all of said amorphous chalcogenide elements in the memory array to a crystalline state simultaneously.

8. The method of claim 7, wherein said step of annealing comprises the step of heating said plurality of amorphous chalcogenide elements to a temperature ranging from about 150 to 400° C. for a time period ranging from about 1 to 60 minutes.

9. The method of claim 7, wherein said chalcogenide material is selected from the group consisting of Se, Te, Ge, Sb and of compositions of at least two of Se, Te, Ge, and Sb.

10. The method of claim 9, wherein said chalcogenide material includes Te, Ge and Sb in the ratio $Te_aGe_bSb_{100-(a+b)}$ where the subscripts are in atomic percentages which total 100% of the constituent elements and $a \leq 70$ and $15 \leq b \leq 50$.

11. The method of claim 10, wherein $40 \leq a \leq 60$ and $17 \leq b \leq 44$.

12. A method of fabricating a plurality of individual chalcogenide elements, comprising the steps of:

forming a memory array comprising a plurality of individual chalcogenide elements on a substrate, said plurality of individual chalcogenide elements being formed in an amorphous state; and annealing all of said plurality of individual chalcogenide elements in the memory array simultaneously to transform said plurality of individual amorphous chalcogenide elements from said amorphous state to a crystalline state.

13. A method of fabricating a plurality of individual chalcogenide elements, consisting essentially of the steps of:

forming a memory array comprising a plurality of individual chalcogenide elements on a substrate, said plurality of individual chalcogenide elements being formed in an amorphous state; and annealing all of said plurality of individual chalcogenide elements in the memory array simultaneously to transform said plurality of individual amorphous chalcogenide elements from said amorphous state to a crystalline state.

14. A method of fabricating a plurality of chalcogenide memory cells, comprising the steps of:

forming a memory array comprising a plurality of individual elements on a substrate, each of said individual elements comprising:

a current controlling device, a first electrode coupled to said current controlling device, a layer of amorphous chalcogenide coupled to said first electrode, and a second electrode coupled to said layer of amorphous chalcogenide; and annealing said layer of amorphous chalcogenide of each of said plurality of individual elements to transform each of said plurality of individual elements in the memory array to a crystalline state simultaneously.

15. A method of fabricating a plurality of chalcogenide memory cells, comprising the steps of:

forming a memory array comprising a plurality of individual elements on a substrate, each of said individual elements comprising:

a current controlling device, a first electrode coupled to said current controlling device, a layer of amorphous chalcogenide coupled to said first electrode, and a second electrode coupled to said layer of amorphous chalcogenide; and transforming said layer of amorphous chalcogenide of each of said plurality of individual elements in the memory array to a crystalline state at once.

* * * * *